(12) United States Patent
Tsai et al.

(10) Patent No.: US 9,711,426 B2
(45) Date of Patent: Jul. 18, 2017

(54) FAN-OUT WAFER LEVEL PACKAGING STRUCTURE

(71) Applicant: Advanced Semiconductor Engineering, Inc., Kaohsiung (TW)

(72) Inventors: Chung-Hsuan Tsai, Kaohsiung (TW); Chuehan Hsieh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/287,506

(22) Filed: Oct. 6, 2016

(65) Prior Publication Data

US 2017/0025322 A1    Jan. 26, 2017

Related U.S. Application Data

(63) Continuation of application No. 14/605,779, filed on Jan. 26, 2015, now Pat. No. 9,484,307.

(51) Int. Cl.
*H01L 23/04* (2006.01)
*H01L 23/31* (2006.01)
(Continued)

(52) U.S. Cl.
CPC ...... *H01L 23/3171* (2013.01); *H01L 23/3107* (2013.01); *H01L 23/3114* (2013.01);
(Continued)

(58) Field of Classification Search
CPC .......................... H01L 23/5386; H01L 23/3114
(Continued)

(56) References Cited

U.S. PATENT DOCUMENTS 7,838,975 B2    11/2010  Chen
8,003,515 B2    8/2011   Meyer et al.
(Continued)

FOREIGN PATENT DOCUMENTS

CN          103890088 A      6/2014
WO     WO-2014/112954 A1    7/2014

OTHER PUBLICATIONS

US Notice of Allowance on U.S. Appl. No. 14/605,779 Dtd Jul. 6, 2016.
(Continued)

*Primary Examiner* — David Vu
*Assistant Examiner* — Brandon Fox
(74) *Attorney, Agent, or Firm* — Foley & Lardner LLP; Cliff Z. Liu

(57) ABSTRACT

A semiconductor device includes a first die including a first pad and a first passivation layer, a second die including a second pad and a second passivation layer, and an encapsulant surrounding the first die and the second die. Surfaces of the first die are not coplanar with corresponding surfaces of the second die. A dielectric layer covers at least portions of the first passivation layer and the second passivation layer, and further covers the encapsulant between the first die and the second die. The encapsulant has a first surface. The dielectric layer has a second surface adjacent to the first passivation layer, the second passivation layer and the encapsulant, and further has a third surface opposite the second surface. The semiconductor device further includes a redistribution layer electrically connected to the first pad and the second pad and disposed above the third surface of the dielectric layer.

16 Claims, 16 Drawing Sheets

(51) Int. Cl.
*H01L 23/538* (2006.01)
*H01L 23/00* (2006.01)
*H01L 25/065* (2006.01)
*H01L 23/495* (2006.01)
*H01L 21/56* (2006.01)
*H01L 21/48* (2006.01)

(52) U.S. Cl.
CPC .... *H01L 23/3135* (2013.01); *H01L 23/49534* (2013.01); *H01L 23/49541* (2013.01); *H01L 23/5386* (2013.01); *H01L 24/05* (2013.01); *H01L 24/17* (2013.01); *H01L 24/19* (2013.01); *H01L 24/20* (2013.01); *H01L 24/96* (2013.01); *H01L 25/0655* (2013.01); *H01L 21/486* (2013.01); *H01L 21/568* (2013.01); *H01L 23/5389* (2013.01); *H01L 2224/04105* (2013.01); *H01L 2224/08137* (2013.01); *H01L 2224/12105* (2013.01); *H01L 2224/16227* (2013.01); *H01L 2224/1712* (2013.01); *H01L 2224/24137* (2013.01); *H01L 2924/15311* (2013.01); *H01L 2924/1811* (2013.01); *H01L 2924/1815* (2013.01)

(58) Field of Classification Search
USPC .......................................................... 257/730
See application file for complete search history.

(56) References Cited

U.S. PATENT DOCUMENTS

| | | |
|---|---|---|
| 8,093,722 B2 | 1/2012 | Chen et al. |
| 8,716,859 B2 | 5/2014 | Meyer et al. |
| 2012/0187568 A1 | 7/2012 | Lin et al. |
| 2013/0026484 A1 | 1/2013 | Walukiewicz et al. |
| 2013/0264684 A1 | 10/2013 | Yu et al. |
| 2013/0307143 A1 | 11/2013 | Lin et al. |
| 2015/0021754 A1* | 1/2015 | Lin .................. H01L 23/5389 257/712 |
| 2015/0084206 A1 | 3/2015 | Lin |
| 2015/0115458 A1* | 4/2015 | Palm .................. H01L 24/31 257/774 |
| 2015/0115475 A1* | 4/2015 | Palm .................. H01L 24/06 257/777 |

OTHER PUBLICATIONS

US Office Action on U.S. Appl. No. 14/605,779 Dtd Feb. 2, 2016.
Office Action with Search Report from corresponding Chinese Patent Application No. 2015110078651, issued on Jan. 5, 2017, 9 pages.

* cited by examiner

FAN-OUT WAFER LEVEL PACKAGING STRUCTURE

CROSS REFERENCE TO RELATED APPLICATIONS

This application is a continuation of U.S. patent application Ser. No. 14/605,779, filed Jan. 26, 2015, the content of which is incorporated herein by reference in its entirety.

TECHNICAL FIELD

The present disclosure relates to a semiconductor packaging structure. In particular, the present disclosure relates to a fan-out wafer level packaging structure.

BACKGROUND

Conventionally, a fan-out wafer level packaging structure contains multiple dies, an encapsulant surrounding the dies, and a redistribution layer electrically connecting the dies, where the redistribution layer is arranged on the dies and the encapsulant. However, a standoff be formed between the dies and the encapsulant, which can cause the redistribution layer to be delaminated and/or broken.

SUMMARY

The present disclosure is directed to fan-out wafer level packaging structures and manufacturing methods thereof.

An aspect of the present disclosure relates to a semiconductor device. In one embodiment, a semiconductor device comprises: a first die comprising a first pad and a first passivation layer; a second die comprising a second pad and a second passivation layer, wherein the first die has a first sidewall and the second die has a second sidewall; an encapsulant surrounding the first die and the second die and comprising a first surface; a dielectric layer covering at least a portion of the first passivation layer and at least a portion of the second passivation layer, and further covering the encapsulant between the first die and the second die, wherein the dielectric layer comprises: a second surface adjacent to the first passivation layer, the second passivation layer and the encapsulant; and a third surface opposite to the second surface; and a redistribution layer electrically connecting to the first pad and the second pad and disposed above the third surface of the dielectric layer.

In another embodiment, a semiconductor package comprises: a substrate, and a semiconductor device mounted on the substrate, wherein the semiconductor device comprises: a first die comprising a first pad and a first passivation layer; a second die comprising a second pad and a second passivation layer, wherein the first die has a first sidewall and the second die has a second sidewall; an encapsulant surrounding the first die and the second die and comprising a first surface; a dielectric layer covering at least a portion of the first passivation layer and at least a portion of the second passivation layer, and further covering the encapsulant between the first die and the second die, wherein the dielectric layer comprises: a second surface adjacent to the first passivation layer, the second passivation layer and the encapsulant; and a third surface opposite to the first surface; and a redistribution layer electrically connecting to the first pad and the second pad and disposed above the third surface of the dielectric layer.

DETAILED DESCRIPTION

The following definitions apply to some of the aspects described with respect to some embodiments of the present disclosure. These definitions may likewise be expanded upon herein.

As used herein, the singular terms "a," "an," and "the" include plural referents unless the context clearly dictates otherwise. Thus, for example, reference to a die can include multiple dies unless the context clearly dictates otherwise.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms such as "inner," "interior," "outer," "exterior," "top," "bottom," "front," "back," "upper," "upwardly," "lower," "downwardly," "vertical," "vertically," "lateral," "laterally," "above," and "below" refer to an orientation of a set of components with respect to one another, such as in accordance with the drawings, but do not require a particular orientation of those components during manufacture or use.

As used herein, the terms "connect," "connected," and "connection" refer to an operational coupling or linking. Connected components can be directly coupled to one another or can be indirectly coupled to one another, such as through another set of components.

As used herein, the terms "about," "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Figure 1:
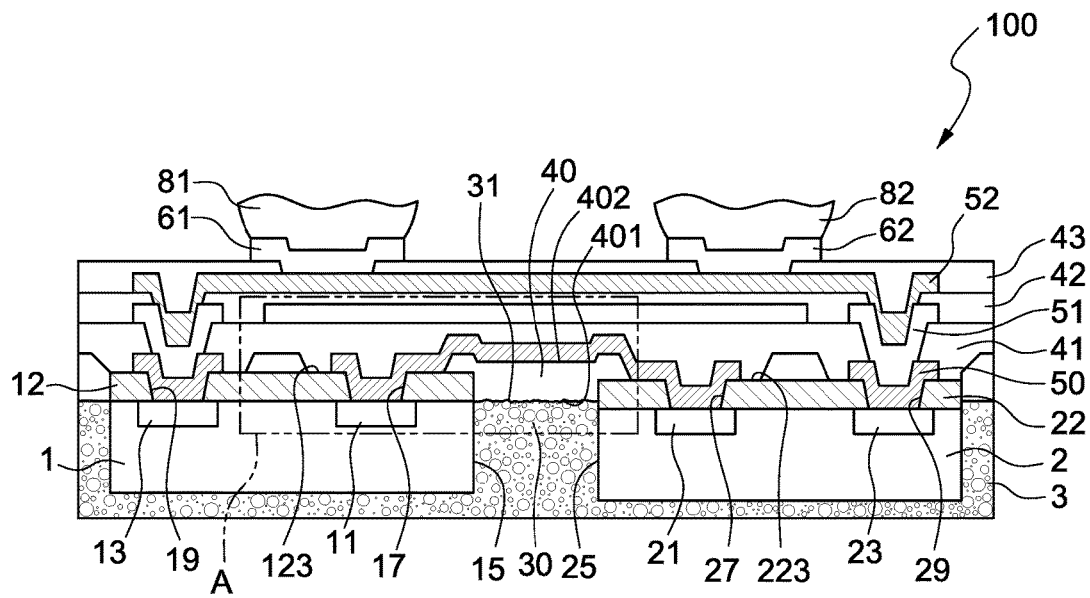
FIG. 1 is a cross-sectional view of a semiconductor device according to a first embodiment of the present disclosure.

FIG. 1 is a cross-sectional view of a semiconductor device 100 according to a first embodiment of the present disclosure. The semiconductor device 100 comprises a first die 1, a second die 2, an encapsulant 3 surrounding the first die 1 and a second die 2, dielectric layers 40, 41, 42, 43, and redistribution layers 50, 51, 52, which are arranged above the first die 1 and the second die 2. The semiconductor device 100 further comprises under bump metallurgies 61, 62 electrically connecting to the redistribution layers 50, 51, 52 and solder balls 81, 82 attached to the under bump metallurgies 61, 62, respectively.

The first die 1 has a first pad 11, a third pad 13, and a first passivation layer 12 arranged above the first pad 11 and the third pad 13. Further, the first passivation layer 12 has two apertures 17, 19, and the first pad 11 and the third pad 13 are exposed in the apertures 17, 19. Likewise, the second die 2 has a second pad 21, a fourth pad 23, and a second passivation layer 22 arranged above the second pad 21 and the fourth pad 23. Further, the second passivation layer 22 has two apertures 27, 29, and the second pad 21 and the fourth pad 23 are exposed in the apertures 27, 29. The first die 1 comprises a first sidewall 15 and the second die 2 comprises a second sidewall 25 A distance between the first sidewall 15 of the first die 1 and the second sidewall 25 of the second die 2 is about 100 micrometers (μm) or less. For example, the distance between the first sidewall 15 of the first die 1 and the second sidewall 25 of the second die 2 may be less than 100 μm, less than 90 μm, less than 80 μm, less than 70 μm, less than 60 μm, or less than 50 μm. The first die 1 and the second die 2 may not be disposed along the same grade or plane. For example, as shown in FIG. 1, the first die 1 is positioned higher than the second die 2. In addition, the first die 1 and the second die 2 may be of the same type (i.e., the same integrated circuit design), or alternatively may be of different types (i.e., different integrated circuit designs). Further, the first die 1 and the second die 2 may have similar sizes or different sizes.

The encapsulant 3 is arranged to surround the first die 1 and the second die 2 so as to enclose the peripheral edges of the first die 1 and the second die 2. Specifically, as shown in FIG. 1, the space between the first die 1 and the second die 2 is filled with the encapsulant 3. Moreover, the encapsulant 3 has a first surface 31. The material of the encapsulant 3 comprises a composite material such as a composite material including epoxy resin and $SiO_2$ filler; the size of the $SiO_2$ fillers typically varies from about 10 μm to about 100 μm, thus the first surface 31 is uneven and has a high surface roughness value in a range from about 50 nanometers (nm) to about 100 nm.

Figure 2:
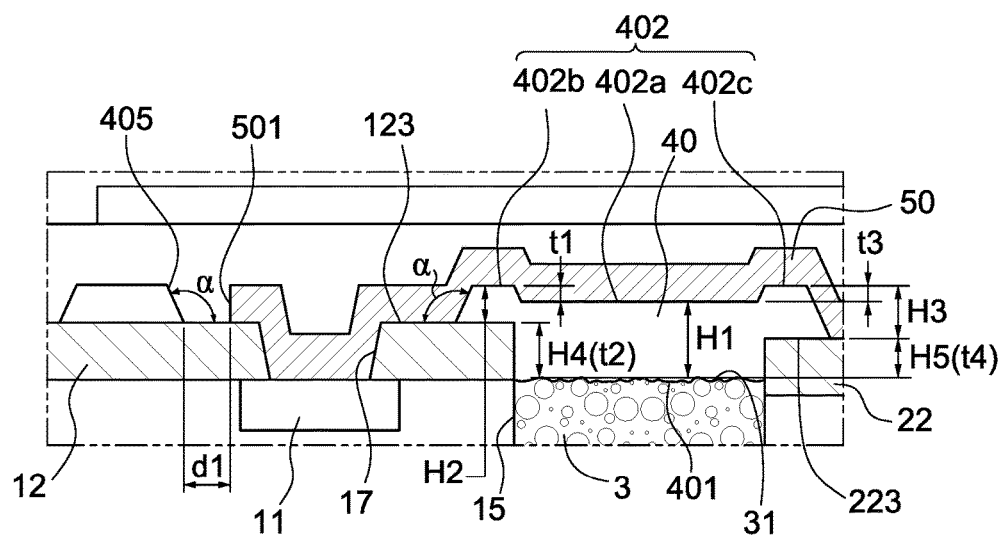
FIG. 2 is an enlarged view of portion "A" in FIG. 1.

FIG. 2 is an enlarged view of portion "A" in FIG. 1. As shown in FIG. 1 and FIG. 2, a first dielectric layer 40 is arranged above the first die 1, the second die 2 and the encapsulant 3. The first dielectric layer 40 covers a portion of the first passivation layer 12 of the first die 1, a portion of the second passivation layer 22 of the second die 2, and the encapsulant 3. In particular, the first dielectric layer 40 has a second surface 401 and a third surface 402, wherein the third surface 402 is opposite to the second surface 401. Further, the third surface 402 has three different portions (see FIG. 2), which are a first portion 402a substantially arranged above the encapsulant 3, a second portion 402b substantially arranged above the first passivation layer 12 and a third portion 402c substantially arranged above the second passivation layer 22. Moreover, the first passivation layer 12 has a fourth surface 123 and the second passivation layer 22 has a fifth surface 223. The second surface 401 of the first dielectric layer 40 is adjacent to the first surface 31 of the encapsulant 3. The first dielectric layer 40 is also adjacent to the fourth surface 123 of the first passivation layer 12 of the first die 1 and the fifth surface 223 of the second passivation layer 22 of the second die 2.

As shown in FIG. 2, a distance H1 between the first portion 402a of the third surface 402 of the first dielectric layer 40 and the first surface 31 of the encapsulant 3 is greater than a distance H2 between the second portion 402b of the third surface 402 of the first dielectric layer 40 and the fourth surface 123 of the first passivation layer 12, and the distance H1 is greater than a distance H3 between the third portion 402c of the third surface 402 of the first dielectric layer 40 and the fifth surface 223 of the second passivation layer 22. In this embodiment, the distance of one or both of H2 or H3 is at least, or greater than, about 5 μm, and the value of H1−H2 or H1−H3 is no greater than, or less than, about 10 μm. In addition, as mentioned above, the first die 1 and the second die 2 may not be disposed along the same grade or plane: a distance H4 between the fourth surface 123 of the first passivation layer 12 and the first surface 31 of the encapsulant 3 may not be equal to a distance H5 between the fifth surface 223 of the second passivation layer 22 and the first surface 31 of the encapsulant 3.

The dielectric layer 40 is preferably an epoxy base or a solder mask which does not include $SiO_2$ fillers. As a result of the absence of $SiO_2$ fillers in the dielectric layer 40, the dielectric layer 40 has a low surface roughness value in a range of about 1 μm to about 5 μm. As will be recognized, the low surface roughness value of the dielectric layer 40 is thus typically less than the high surface roughness value of the encapsulant 3. That is, the dielectric layer 40 is smoother than the encapsulant 3, which provides the advantage of avoiding a first redistribution layer 50 being easily delaminated or broken while extending on the first surface 402 of the first dielectric layer 40.

In addition, the coefficient of thermal expansion of the first dielectric layer 40 is about $65 \times 10^{-6}/°$ C., which is approximately equal to the coefficient of thermal expansion of the encapsulant 3, so the warpage of the semiconductor device 100 will be reduced.

The first redistribution layer 50 is disposed above the first dielectric layer 40, the first die 1 and the second die 2, but does not contact the encapsulant 3. Preferably, the first redistribution layer 50 has a thickness of about 3 μm or less. With reference to FIG. 1, a portion of the first redistribution layer 50 is arranged to electrically connect to the first pad 11 of the first die 1 and the second pad 21 of the second die 2: the portion of the first redistribution layer 50 is attached to the first pad 11 and the second pad 21, and extends across portions of the first passivation layer 12 and the second passivation layer 22 that are adjacent to the encapsulant 3 filled between the first die 1 and the second die 2. The portion of the first redistribution layer 50 further extends across a portion of the first dielectric layer 40 that is disposed above the encapsulant 3 filled between the first die 1 and the second die 2. In particular, the portion of the first redistribution layer 50 which electrically connects the first pad 11 of the first die 1 and the second pad 21 of the second die 2 extends on the third surface 402 of the first dielectric layer 40, rather than on the first surface 31 of the encapsulant 3. In other words, the portion of the first redistribution layer 50 is spaced apart from the encapsulant 3. As mentioned above, due to the material characteristics of the first dielectric layer 40, the low surface roughness value of the third surface 402 of the first dielectric layer 40 is less than the high surface roughness value of the first surface 31 of the encapsulant 3. Thus, the configuration illustrated in FIGS. 1 and 2 reduces the likelihood that the first redistribution layer 50 will be delaminated or broken.

The first redistribution layer 50 further includes additional portions attached to the third pad 13 in the aperture 19 and the fourth pad 23 in the aperture 29, and extending onto the fourth surface 123 of the first passivation layer 12 and on the fifth surface 223 of the second passivation layer 22, respectively. These additional portions also do not contact the encapsulant 3.

A second dielectric layer 41 is arranged on the first dielectric layer 40, the first redistribution layer 50, the first passivation layers 12, and the second passivation layer 22. The material of the second dielectric layer 41 may be similar to or different from that of the first dielectric layer 40.

A second redistribution layer 51 is arranged on the second dielectric layer 41 and the first redistribution layer 50, and electrically connects to the first redistribution layer 50. In particular, portions of the second redistribution layer 51 are stacked on the portions of the first redistribution layer 50 attached to the second pad 13 of the first die 1 and the fourth pad 23 of the second die 2. The second redistribution layer 51 is used as a grounded layer.

A third dielectric layer 42 is arranged on the second dielectric layer 41 and exposes portions of the second redistribution layer 51. The material of the third dielectric layer 42 may be similar to or different from that of the first dielectric layer 40 or the second dielectric layer 41.

A third redistribution layer 52 is arranged on the third dielectric layer 42 and the second redistribution layer 51, and electrically connects to the first and second redistribution layers 50, 51, respectively. In particular, portions of the third redistribution layer 52 are stacked on portions of the second redistribution layer 51, which are in turn stacked on portions of the first redistribution layer 50. As shown in FIG. 1, the third redistribution layer 52 electrically connects to the third pad 13 in the aperture 19 and the fourth pad 23 in the aperture 29, and thus electrically connects to the first die 1 and the second die 2.

A fourth dielectric layer 43 is arranged on the third dielectric layer 42 and exposes portions of the third redistribution layer 52. The material of the fourth dielectric layer 43 may be similar to or different from that of the first dielectric layer 40, the second dielectric layer 41, or the third dielectric layer 42.

Under bump metallurgies 61, 62 are arranged on the fourth dielectric layer 43 and exposed portions of the third redistribution layer 52, and electrically connect to the first, second and third redistribution layers 50, 51, 52, respectively. Solder balls 81 and 82 are attached to the under bump metallurgies 61, 62, respectively.

With reference to FIG. 1 and FIG. 2, the passivation layer 12 partially covers the first pad 11 the third pad 13, resulting in a standoff distance H4 between the fourth surface 123 of the first passivation layer 12 and the first surface 31 of the encapsulant 3. If the redistribution layer 50 were to be disposed directly on the encapsulant 3, the standoff distance H4, particularly in combination with different material properties and the rough surface of encapsulant 3, could lead to delamination. To mitigate this problem, the first dielectric layer 40 partially covers the passivation layer 12 and the encapsulant 3.

As described above, the distance H1 is between the first portion 402a of the third surface 402 of the first dielectric layer 40 and the first surface 31 of the encapsulant 3; the distance H2 is between the second portion 402b of the third surface 402 of the first dielectric layer 40 and the fourth surface 123 of the first passivation layer 12; and the distance H4 is between the fourth surface 123 of the first passivation layer 12 and the first surface 31 of the encapsulant 3. The distance H1 is greater than the distance H4, thus the dielectric layer 40 fills up the standoff between the fourth surface 123 of the passivation layer 12 and the first surface 31 of the encapsulant 3. The distance H1 is also greater than the distance H2.

An angle α formed between the fourth surface 123 of the first passivation layer 12 and a side surface 405 of the first dielectric layer 40 will be greater than about 90 degrees, preferably about 110 to about 140 degrees. The side surface 405 of the first dielectric layer 40 is formed between the second surface 401 and the third surface 402 of the first dielectric layer 40. An angle α greater than 90 degrees further mitigates against delamination or breakage of the redistribution layer 50.

A portion of the first dielectric layer 40 does not contact the first redistribution layer 50; there is a distance dl between the side surface 405 of the first dielectric layer 40 and a side surface 501 of the first redistribution layer 50. The distance dl further mitigates against delamination due to stress.

The planarity of the third surface 402 of the dielectric layer 40 is greater than about 90%, wherein the planarity of the first dielectric layer 40 is obtained through the equation $100 \times [1-t1/t2](\%)$ or $100 \times [t3/t4](\%)$, wherein t1 represents the distance between the first portion 402a and the second portion 402b of the third surface 402 of the dielectric layer 40; t2 represents the distance between the fourth surface 123 of the first passivation layer 12 and the second surface 401 of the first dielectric layer 40; t3 represents the distance between the first portion 402a and the third portion 402c of the third surface 402 of the dielectric layer 40; and t4 represents the distance between the fifth surface 223 of the second passivation layer 22 and the second surface 401 of the first dielectric layer 40. As shown in FIG. 2, t1 is smaller than t2 and/or t3 is smaller than t4. The larger the value of the planarity of the first dielectric layer 40 is, the less variation there is of the third surface 402 of the first dielectric layer 40. Generally speaking, the variation of the third surface 402 of the first dielectric layer 40 is affected by that of the second surface 401 of the first dielectric layer 40 In some embodiments, however, due to the material characteristics of the first dielectric layer 40, the variation of the third surface 402 of the first dielectric layer 40 could be unaffected by the variation of the second surface 401 of the first dielectric layer 40. The advantage of the material characteristics of the first dielectric layer 40 is to provide a smooth surface for extension of the first redistribution layer 50 on the first dielectric layer 40, and thus, the delamination of the first redistribution layer 50 from the standoff between the fourth surface 123 of the passivation layer 12 and the first surface 31 of the encapsulant 3 can be avoided.

In sum, the first redistribution layer 50 partially covers the passivation layer 12 and the first dielectric layer 40. The portion of the first redistribution layer 50 which electrically connects to the first die 1 and the second die 2 is attached to the first pad 11 in the aperture 17 and extends across the fourth surface 123 of the first passivation layer 12 and the third surface 402 of the first dielectric layer 40 disposed on the encapsulant 3. As mentioned above, since the material of the encapsulant 3 contains fillers with different sizes, the first surface 31 is uneven and has a surface roughness value in the range of about 50 nm to about 100 nm. If there were no first dielectric layer 40, the portion of the first redistribution layer 50 which electrically connects to the first die 1 and the second die 2 would extend on the first surface 31 of the encapsulant 3 directly and would be easily peeled and broken due to the uneven first surface 31. As described in this disclosure, however, the first dielectric layer 40 covers the first surface 31 of the encapsulant 3 and provides the smoother third surface 402 with a surface roughness value in the range of about 1 nm to about 10 nm. Thus, the portion of the first redistribution layer 50 extending on the third surface 402 of the first dielectric layer 40 will be less susceptible to delamination and breakage. Further, if there were no first dialectic layer 40, the portion of the first redistribution layer 50 which electrically connects to the first die 1 and the second die 2 would have improper curvature at the standoff, and the first redistribution layer 50 would be more readily peeled and broken. As described in this disclosure, however, the portion of the first dielectric layer 40 covering the encapsulant 3 filled between the first die 1 and the second die 2 provides the sides with gentle slopes to be even less susceptible to delamination and breakage.

FIG. 3A through FIG. 3L are cross-sectional views showing a method of manufacturing a semiconductor device 100 in accordance with an embodiment of this disclosure.

Figure 3A:
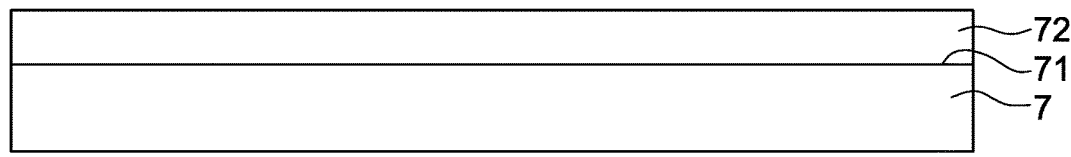
FIG. 3A, FIG. 3B, FIG. 3C, FIG. 3D, FIG. 3E, FIG. 3F, FIG. 3G, FIG. 3H, FIG. 3I, FIG. 3J, FIG. 3K and FIG. 3L are cross-sectional views showing a method of manufacturing a semiconductor device according to the first embodiment of the present disclosure.

With reference to FIG. 3A, a carrier 7 is provided and an adhesion layer 72 is positioned adjacent to a top surface 71 of the carrier 7.

Figure 3B:
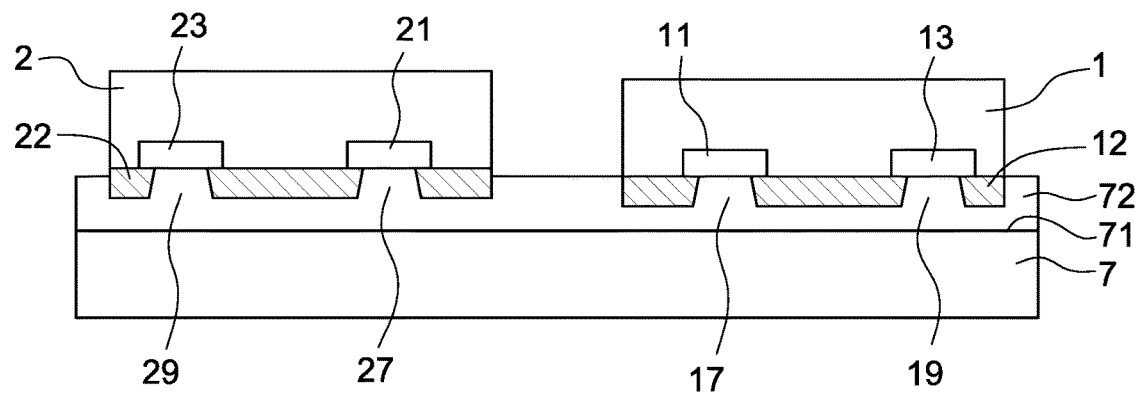

With reference to FIG. 3B, a first die 1 and a second die 2 are positioned adjacent to the adhesion layer 72. A first passivation layer 12 of the first die 1 and a second passivation layer 22 of the second die 2 substantially face the adhesion layer 72. The first passivation layer 12 of the first die 1 has two apertures 17, 19, and the second passivation layer 22 of the second die 2 has two apertures 27, 29. Thus, the first pad 11 and the third pad 13 of the first die 1, and the second pad 21 and the fourth pad 23 of the second die 2, may be partially exposed in respective apertures 17, 19, 27, 29. Due to the weights of the first and second dies 1 and 2, they sink into the adhesion layer 72 while being positioned on the adhesion layer 72. Moreover, as illustrated in this embodiment, the weight of the first die 1 is greater than the weight of the second die 2, and thus the position of the first die 1 is lower than that of the second die 2. In other embodiments, the first die 1 is the same weight or greater than the weight of the second die 2, but the position of the first die 1 may be lower than that of the second die 2 due to the process.

Figure 3C:
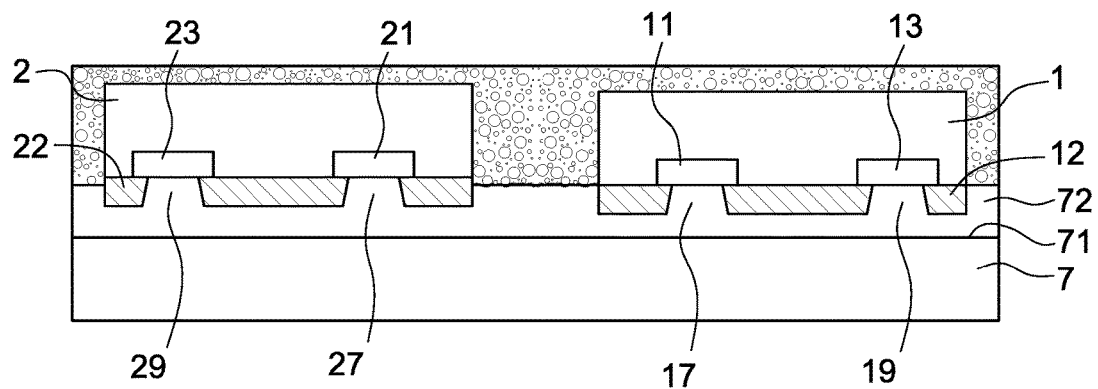

With reference to FIG. 3C, the first die 1 and the second die 2 are covered with an encapsulant 3; thereby, the encapsulant 3 surrounds the first die 1 and the second die 2.

Figure 3D:
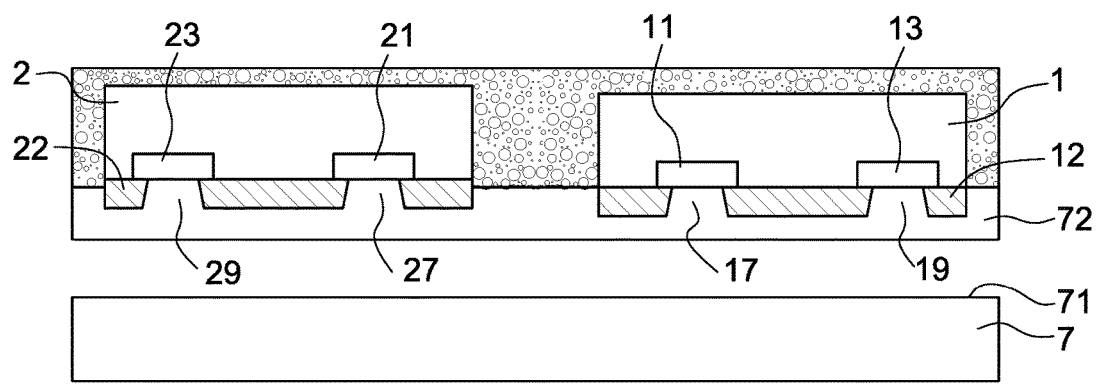

With reference to FIG. 3D, the carrier 7 is removed by a heat process.

Figure 3E:
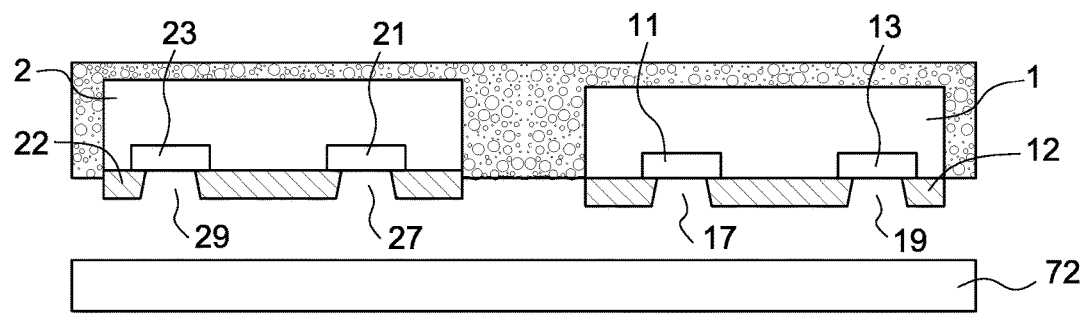

With reference to FIG. 3E, the adhesion layer 72 is removed by a heat process.

Figure 3F:
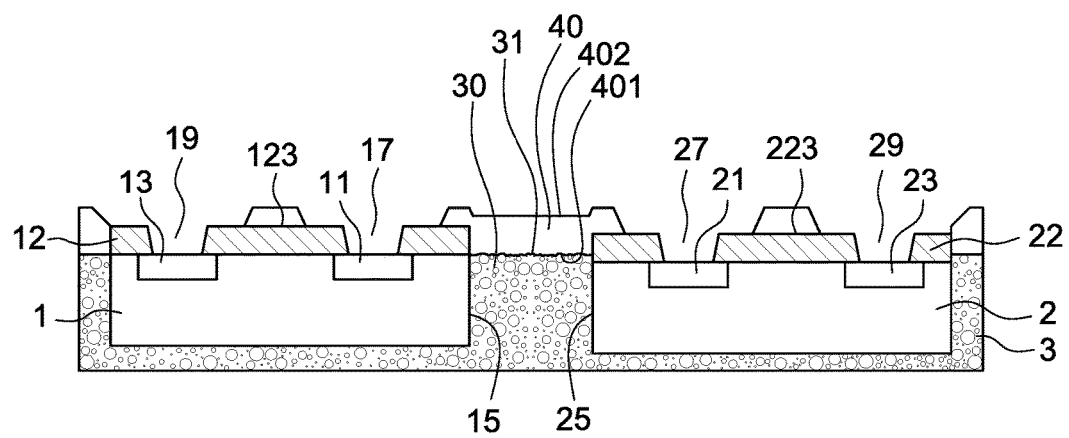

With reference to FIG. 3F, a first dielectric layer 40 is formed to cover the encapsulant 3 and to cover portions of the first passivation layer 12 of the first die 1 and the second passivation layer 22 of the second die 2. The first dielectric layer 40 is further adjacent to a fourth surface 123 of the first passivation layer 12 of the first die 1 and a fifth surface 223 of the second passivation layer 22 of the second die 2. A second surface 401 of the first dielectric layer 40 is adjacent to a first surface 31 of the encapsulant 3. The surface roughness of the third surface 402 of the first dielectric layer 40 is less than the surface roughness of the first surface 31 of the encapsulant 3.

Figure 3G:
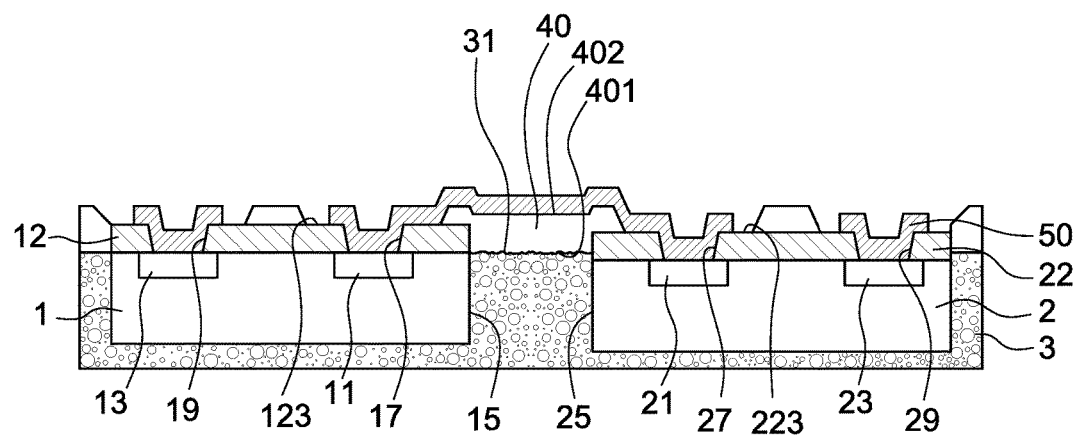

With reference to FIG. 3G, the first redistribution layer 50 is provided, wherein a portion of the first redistribution layer 50 is arranged to electrically connect to the first pad 11 of the first die 1 and the second pad 21 of the second die 2, and other portions of the first redistribution layer 50 are arranged to electrically connect to the third pad 13 of the first die 1 in aperture 19 and the fourth pad 23 of the second pad 2 in aperture 29. The portion of the first redistribution layer 50 electrically connecting to the first pad 11 of the first die 1 and the second pad 21 of the second die 2 is attached to the first pad 11 and the second pad 21 and extends across portions of the first passivation layer 12 and the second passivation layer 22 adjacent to the encapsulant 3 filled between the first die 1 and the second die 2, and further extends across a portion of the first dielectric layer 40 disposed above the encapsulant 3 filled between the first die 1 and the second die 2.

The material of the first redistribution layer 50 can be a metal, a metal alloy, or another electrically conductive material.

Figure 3H:
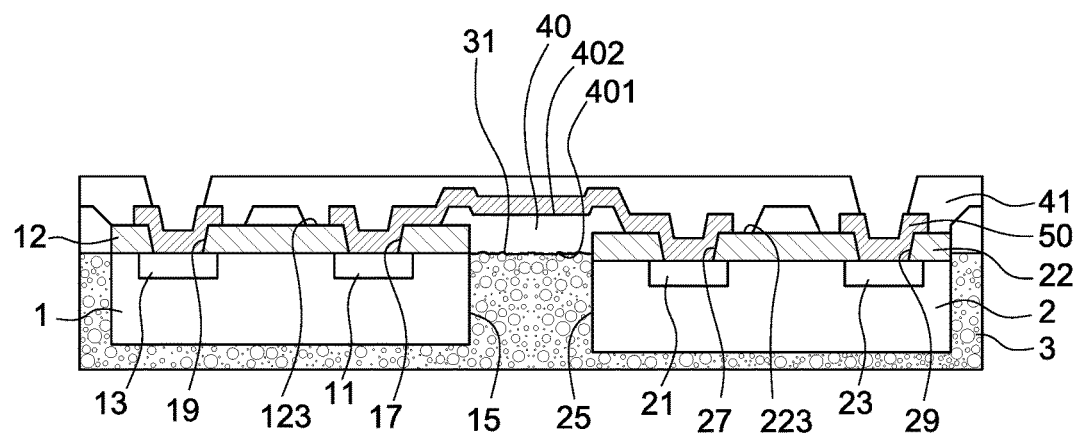

With reference to FIG. 3H, a second dielectric layer 41, which may be similar to or different from the first dielectric layer 40, is arranged on the first dielectric layer 40, the first redistribution layer 50 and the first and second passivation layers 12, 22, respectively.

Figure 3I:
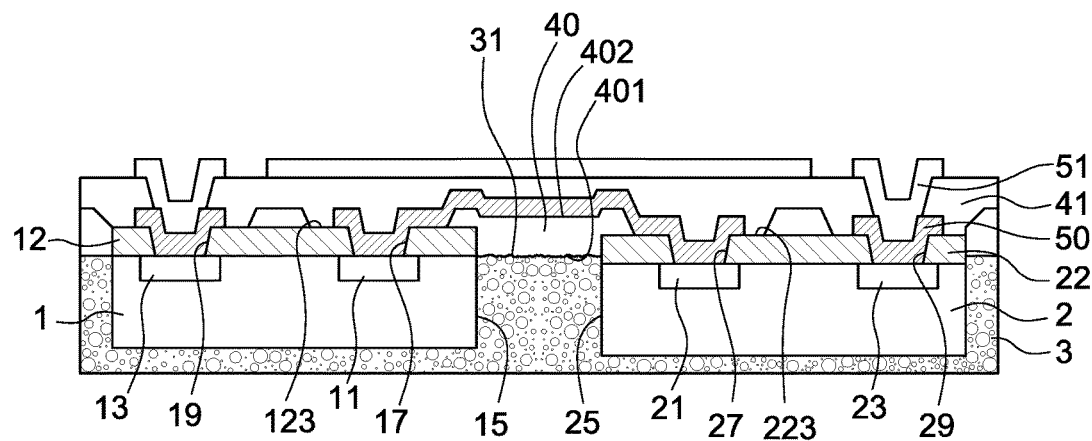

With reference to FIG. 3I, a second redistribution layer 51 is arranged on the second dielectric layer 41 and attached to the first redistribution layer 50. In particular, portions of the second redistribution layer 51 are stacked on portions of the first redistribution layer 50 attached to the second pad 13 of the first die 1 and the fourth pad 23 of the second die 2. The material of the second redistribution layer 51 can be a metal, a metal alloy, or another electrically conductive material.

Figure 3J:
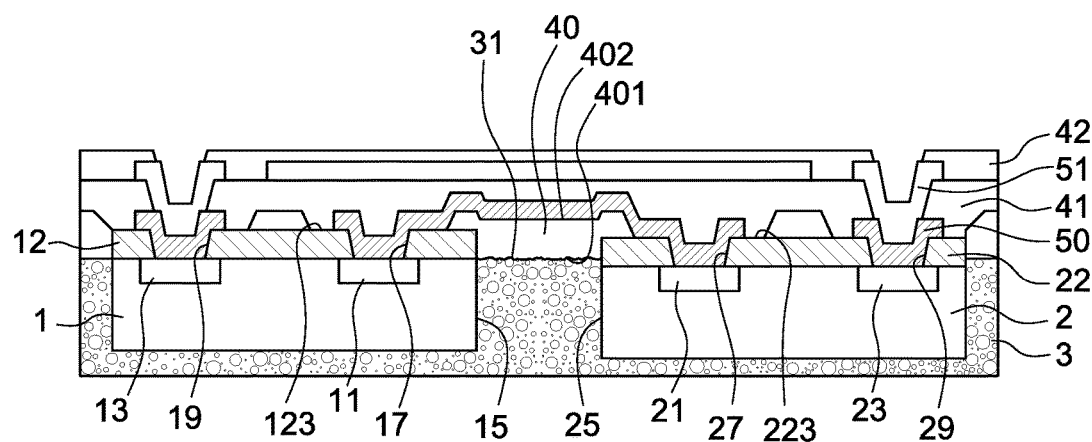

With reference to FIG. 3J, a third dielectric layer 42, which may be similar to or different from the first dielectric layer 40 or the second dielectric layer 41, is arranged on the second dielectric layer 41 and the second redistribution layer 51.

Figure 3K:
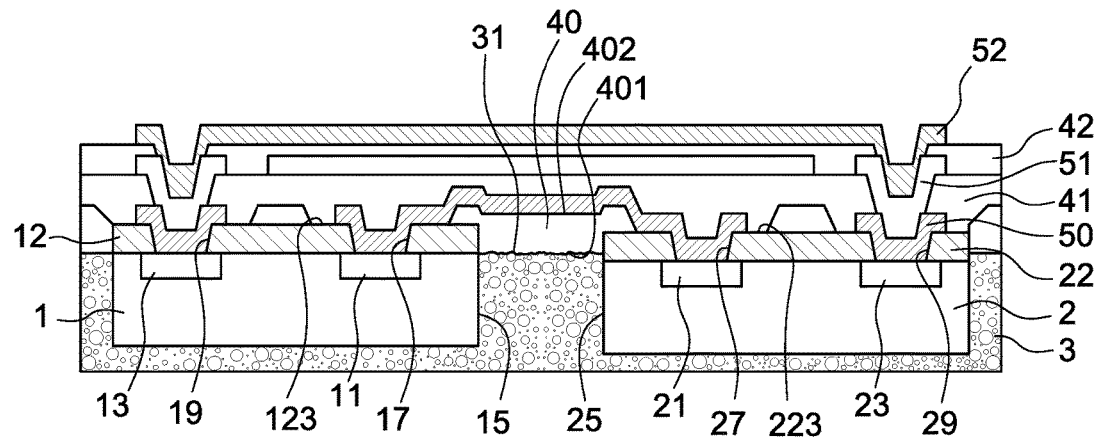
Figure 3L:
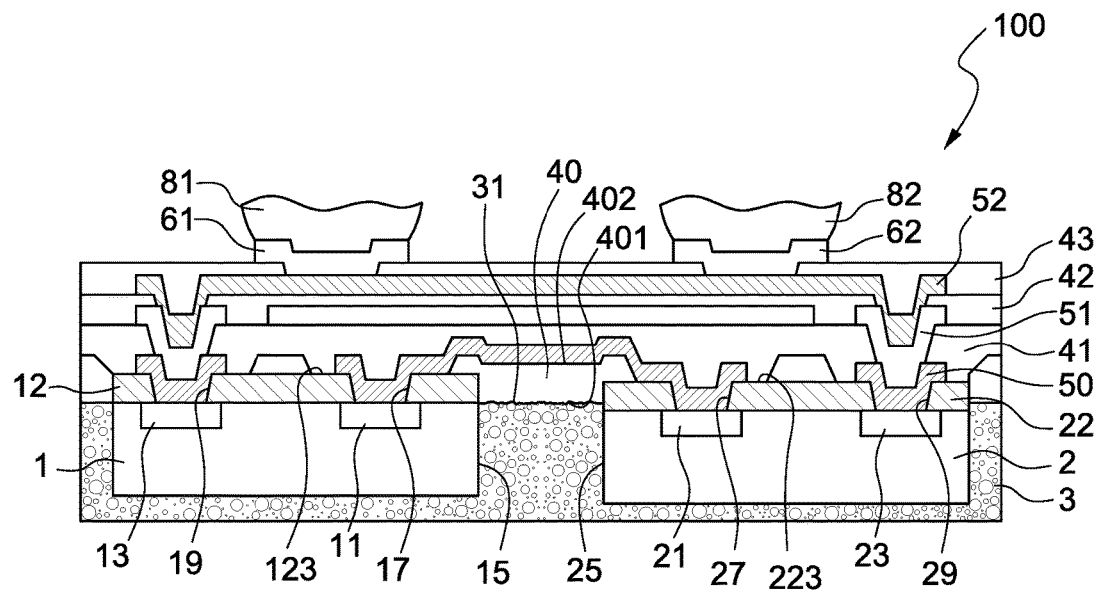

With reference to FIG. 3K, a third redistribution layer 52 is arranged on the third dielectric layer 42 and attached to the second redistribution layer 51. In this way, the third redistribution layer 52 electrically connects to the first and second redistribution layers 50, 51, respectively. In particular, portions of the third redistribution layer 52 are stacked on the portions of the second redistribution layer 51, which are in turn stacked on the portions of the first redistribution layer 50. As shown in FIG. 3K, the third redistribution layer 52 electrically connects to the third pad 13 in the aperture 19 and the fourth pad 23 in the aperture 29, and thus electrically connects to the first die 1 and the second die 2, respectively. The material of the third redistribution layer 52 can be a metal, a metal alloy, or another electrically conductive material With reference to FIG. 3L, a fourth dielectric layer 43, which may be similar to or different from the first dielectric layer 40, the second dielectric layer 41, or the third dielectric layer 42, is arranged on the third dielectric layer 42 and the third redistribution layer 52. Under bump metallurgies 61, 62 are arranged on the fourth dielectric layer 43 and attached to the third redistribution layer 52, and thus electrically connect to the first, second and third redistribution layers 50, 51, 52, respectively. In addition, solder balls 81 and 82 are attached to the two under bump metallurgies 61, 62, respectively.

Figure 4:
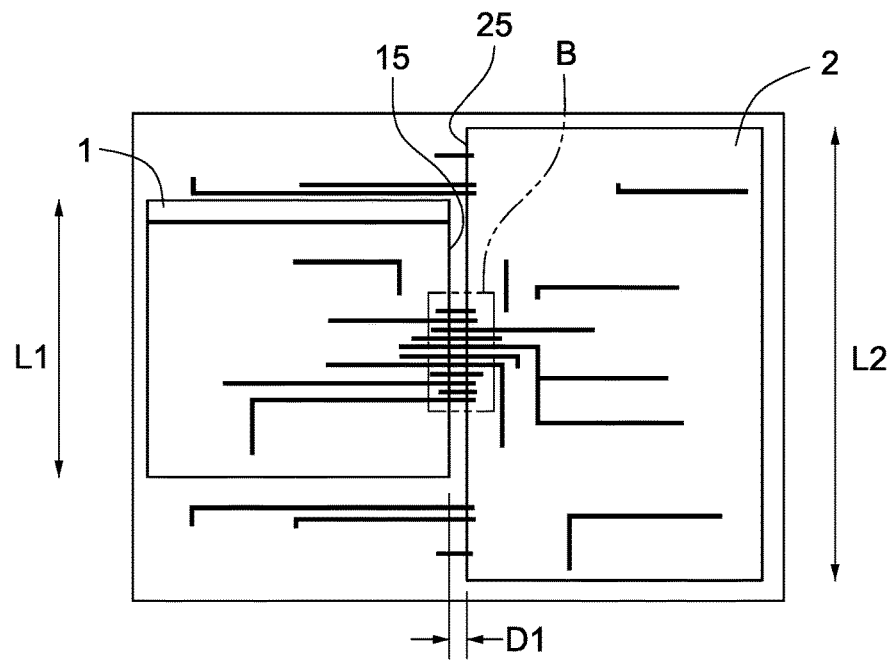
FIG. 4 is a bottom view of a semiconductor device according to the first embodiment of the present disclosure.

FIG. 4 is a bottom view of a semiconductor device 100 such as is shown in FIG. 1.

In the embodiment shown in FIG. 4, a length L1 along a first sidewall 15 of the first die 1 is about 10 millimeters (mm), a length L2 along a second sidewall 25 of the second die 2 is about 20 mm, and a distance D1 between the first sidewall 15 of the first die 1 and the second sidewall 25 of the second die 2 is about 100 Thus, the ratio of L1 to D1, and the ratio of L2 to D1, is greater than 100. Further, the first redistribution layer (i.e., redistribution layer 50) may provide more than 1000 connections in a narrow area (portion B in FIG. 4) between the first die 1 and the second die 2.

Figure 5:
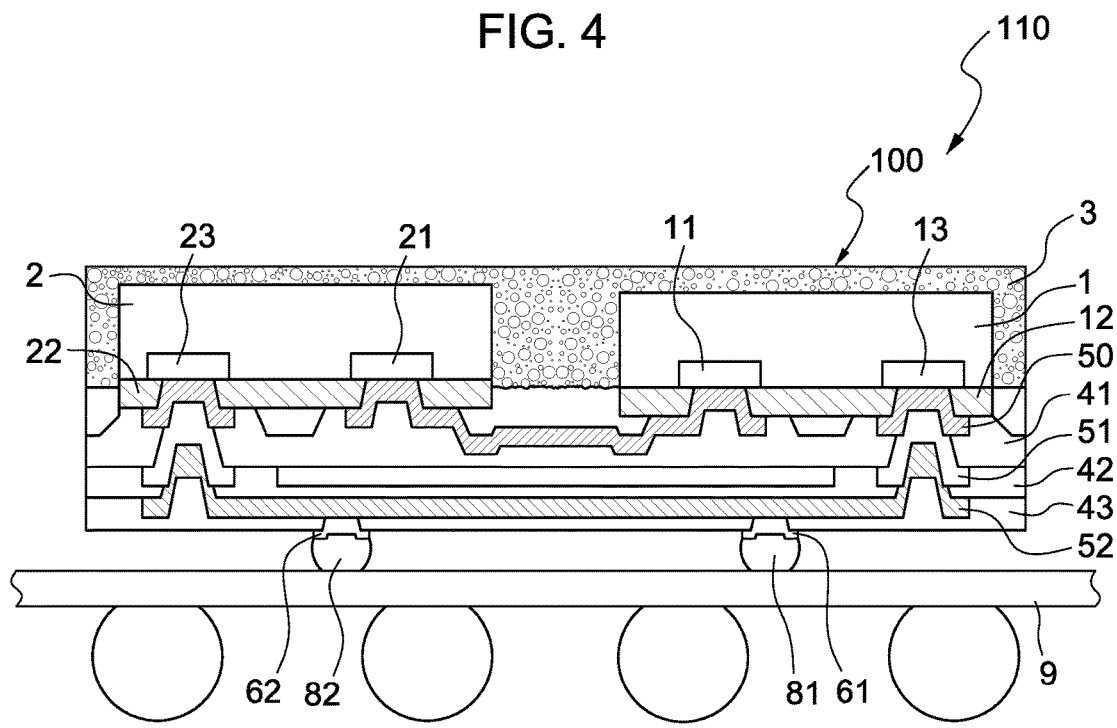
FIG. 5 is a cross-sectional view of a semiconductor package structure including the semiconductor device according to the first embodiment of the present disclosure.

FIG. 5 is a cross-sectional view of a semiconductor package structure including a semiconductor device according to one embodiment of the present disclosure.

FIG. 5 illustrates a semiconductor package structure 110 comprising a semiconductor device 100 and a substrate 9, wherein the semiconductor device 100 is attached to the substrate 9 by solder balls 81 and 82. The substrate 9 is a package substrate, which can be, for example, metal, ceramic, glass-reinforced epoxy (e.g., FR4), polyimide, silicon, or Bismaleimide/Triazine (BT) resin.

Figure 6:
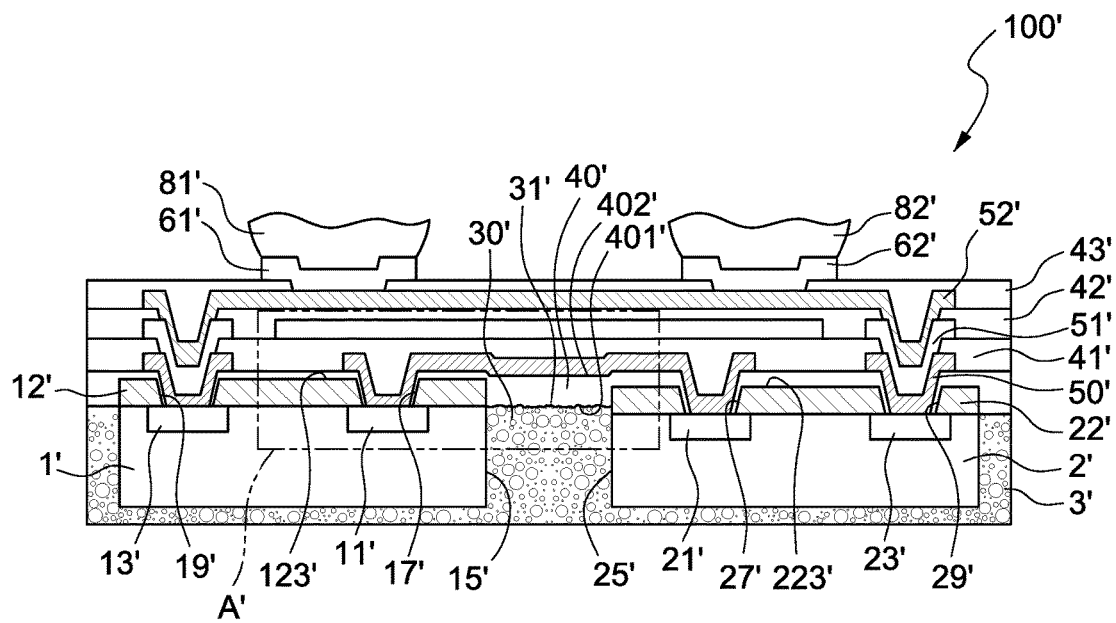
FIG. 6 is a cross-sectional view of a semiconductor device according to a second embodiment of the present disclosure.

FIG. 6 is a cross-sectional view of a semiconductor device 100' according to a second embodiment of the present disclosure. 'The semiconductor device 100' comprises a first die 1', a second die 2', an encapsulant 3' surrounding the first die 1' and the second die 2', dielectric layers 40', 41', 42', 43', redistribution layers 50', 51', 52', " under bump metallurgies 61', 62' electrically connecting to the redistribution layers 50', 51', 52', and solder balls 81', 82' attached to the under bump metallurgies 61', 62', respectively.

The first die 1' has a first pad 11' and a third pad 13', and a first passivation layer 12' arranged above the first pad 11' and the third pad 13'. Further, the first passivation layer 12' includes two apertures 17', 19' through which the first pad 11' and the third pad 13', respectively, are exposed. Likewise, the second die 2' has a second pad 21' and a fourth pad 23', and a second passivation layer 22' arranged above the second pad 21' and the fourth pad 23'. Further, the second passivation layer 22' includes two apertures 27', 29' through which the second pad 21' and the fourth pad 23', respectively, are exposed. The first die 1' comprises a first sidewall 15', and the second die 2' comprises a second sidewall 25'. A distance between the first sidewall 15' of the first die 1' and the second sidewall 25' of the second die 2' is about 100 μm or less. For example, the distance between the first sidewall 15' of the first die 1' and the second sidewall 25' of the second die 2' may be less than 100 μm, less than 90 μm, less than 80 μm, less than 70 μm, less than 60 μm, or less than 50 μm. The first die 1' and the second die 2' may not be disposed along the same grade or plane. For example, as shown in FIG. 6, the first die 1' is positioned higher than the second die 2'. In addition, the first die 1' and the second die 2' may be of the same type (i.e., the same integrated circuit design), or alternatively may be of different types (i.e., different integrated circuit designs). Further, the first die 1' and the second die 2' may have similar sizes or different sizes.

The encapsulant 3' is arranged to surround the first die 1' and the second die 2' so as to enclose the peripheral edges of the first die 1' and the second die 2'. Specifically, as shown in FIG. 6, the space between the first die 1' and the second die 2' is filled with the encapsulant 3'. The encapsulant 3' has a first surface 31'. The material of the encapsulant 3' comprises a composite material which includes epoxy resin and $SiO_2$ filler, and the size of the $SiO_2$ fillers typically varies from about 10 μm to about 100 μm, so the first surface 31' is uneven and has a surface roughness value in a range from about 50 to 100 nm.

Figure 7:
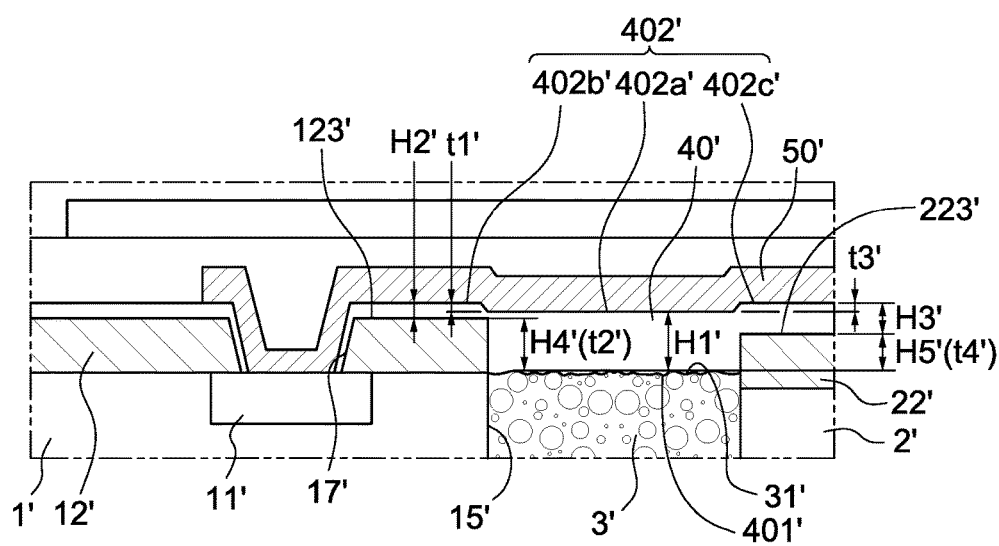
FIG. 7 is an enlarged view of portion "A" in FIG. 6.

FIG. 7 is an enlarged view of portion "A" in FIG. 6. As shown in FIG. 6 and FIG. 7, the first dielectric layer 40' is arranged above the first die 1', the second die 2' and the encapsulant 3'. As shown in FIG. 6, the first dielectric layer 40' covers the whole first passivation layer 12' of the first die 1', the whole second passivation layer 22' of the second die 2', and the encapsulant 3'. The first dielectric layer 40' has a second surface 401' and a third surface 402', where the third surface 402' is opposite to the second surface 401'. The third surface 402' has three different portions: a first portion 402a' arranged above the encapsulant 3', a second portion 402b' arranged above the first passivation layer 12', and a third portion 402c' arranged above the second passivation layer 22'. The first passivation layer 12' has a fourth surface 123' and the second passivation layer 22' has a fifth surface 223'. The second surface 401' of the first dielectric layer 40' is adjacent to the first surface 31' of the encapsulant 3'. The first dielectric layer 40' is further adjacent to the fourth surface 123' of the first passivation layer 12' of the first die 1' and the fifth surface 223' of the second passivation layer 22' of the second die 2'.

As shown in FIG. 7, a distance H1' between the first portion 402a' of the third surface 402' of the first dielectric layer 40' and the first surface 31' of the encapsulant 3' is greater than a distance H2' between the second portion 402b' of the third surface 402' of the first dielectric layer 40' and the fourth surface 123' of the first passivation layer 12'. Additionally, the distance H1' is greater than a distance H3' between the third portion 402c' of the third surface 402' of the first dielectric layer 40' and the fifth surface 223' of the second passivation layer 22'. In some embodiments, the distance H2' and/or H3' is at least, or greater than, about 5 and the difference of H1'–H2' or H1'–H3' is no greater than, or less than, about 10 In addition, as mentioned above, the first die 1' and the second die 2' may not be disposed along the same grade or plane; thus a distance H4' between the fourth surface 123' of the first passivation layer 12' and the first surface 31' of the encapsulant 3' may not be equal to a distance H5' between the fifth surface 223' of the second passivation layer 22' and the first surface 31' of the encapsulant 3'. As shown in FIG. 6, the first dielectric layer 40' extends into the apertures 17', 19', 27', 29', which is accomplished by using a pull-in process.

The first dielectric layer 40' is preferably an epoxy base or a solder mask which does not include $SiO_2$ fillers. As a result of the absence of $SiO_2$ fillers in the dielectric layer 40', the dielectric layer 40' has a surface roughness value in a range of about 1 μm to about 5 As will be recognized, the surface roughness value of the dielectric layer 40' is thus typically less than the surface roughness value of the encapsulant 3'. That is, dielectric layer 40' is smoother than the encapsulant 3', thereby avoiding the first redistribution layer 50' from being easily delaminated or broken when extended on the first surface 402' of the first dielectric layer 40'.

In addition, the coefficient of thermal expansion of the first dielectric layer 40' is about $65 \times 10^{-6}/°$ C., which is approximately equal to the coefficient of thermal expansion of the encapsulant 3', so the warpage of the semiconductor device 100' will be reduced.

The first redistribution layer 50' is disposed above the first dielectric layer 40', the first die 1' and the second die 2', but does not contact the encapsulant 3'. Preferably, the first redistribution layer 50' has a thickness of about 3 μm or less. With reference to FIG. 6, a portion of the first redistribution layer 50' is arranged to electrically connect to the first pad 11' of the first die 1' and the second pad 21' of the second die 2'. The portion of the first redistribution layer 50' is attached to the first pad 11' and the second pad 21', and extends across a portion of the first dielectric layer 40' that is disposed above the encapsulant 3' filled between the first die 1' and the second die 2'. In particular, the portion of the first redistribution layer 50' which electrically connects to the first pad 11' of the first die 1' and the second pad 21' of the second die 2' extends on the third surface 402' of the first dielectric layer 40' arranged above the encapsulant 3' filled between the first die 1' and the second die 2', rather than on the first surface 31' of the encapsulant 3' filled between the first die 1' and the second die 2'. In other words, the portion of the first redistribution layer 50' is spaced apart from the encapsulant 3'. As mentioned above, due to the material characteristics of the first dielectric layer 40', the surface roughness value of the third surface 402' of the first dielectric layer 40' is less than the surface roughness value of the first surface 31' of the encapsulant 3'. In such manner, the first redistribution layer 50' will not be easily delaminated or broken when extended on the third surface 402' of the first dielectric layer 40'.

Other portions of the first redistribution layer 50' are attached to the third pad 13' in the aperture 19' and the fourth pad 23' in the aperture 29'.

A second dielectric layer 41' is arranged on the first dielectric layer 40' and the first redistribution layer 50'. The material of the second dielectric layer 41' may be similar to or different from that of the first dielectric layer 40'.

A second redistribution layer 51' is arranged on the second dielectric layer 41' and attached to the first redistribution layer 50', and thus electrically connects to the first redistribution layer 50'. In particular, portions of the second redistribution layer 51' are stacked on portions of the first redistribution layer 50' attached to the second pad 13' of the first die 1' and the fourth pad 23' of the second die 2'. The second redistribution layer 51 is used as a grounded layer.

A third dielectric layer 42' is arranged on the second dielectric layer 41'. The material of the third dielectric layer 42' may be similar to or different from that of the first dielectric layer 40' or the second dielectric layer 41'.

A third redistribution layer 52' is arranged on the third dielectric layer 42' and is attached to the second redistribution layer 51', and thus electrically connects to the first and second redistribution layers 50', 51', respectively. In particular, portions of the third redistribution layer 52' are stacked on portions of the second redistribution layer 51', which in turn is stacked on portions of the first redistribution layer 50'. As shown in FIG. 6, the third redistribution layer 52' electrically connects to the third pad 13' in the aperture 19' and the fourth pad 23' in the aperture 29', and thus electrically connects to the first die 1' and the second die 2', respectively.

A fourth dielectric layer 43' is arranged on the third dielectric layer 42'. The material of the fourth dielectric layer 43' may be similar to or different from that of the first dielectric layer 40', the second dielectric layer 41', or the third dielectric layer 42'. Under bump metallurgies 61', 62' are arranged on the fourth dielectric layer 43 and attached to the third redistribution layer 52', and thus electrically connect to the first, second and third redistribution layers 50', 51', 52', respectively. Solder balls 81' and 82' are attached to the bump metallurgies 61', 62', respectively.

The first dielectric layer 40' totally covers the passivation layer 12' and the encapsulant 3'. As stated above, the distance H1' is between the first portion 402a' of the third surface 402' of the first dielectric layer 40' and the first surface 31' of the encapsulant 3'; the distance H2' is between the first portion 402b' of the third surface 402' of the first dielectric layer 40' and the fourth surface 123' of the first passivation layer 12'; and the distance H4' between the fourth surface 123' of the first passivation layer 12' and the first surface 31' of the encapsulant 3'. The distance H1' is greater than the distance H4', thus the dielectric layer 40 fills up the standoff between the fourth surface 123' of the passivation layer 12' and the first surface 31' of the encapsulant 3'. The distance H1' is also greater than the distance H2'.

The planarity of the third surface 402' of the dielectric layer 40' is greater than about 90%, wherein the planarity of the first dielectric layer 40' is obtained through the equation $100 \times [1-t1'/t2'](\%)$ or $100 \times [1-t3'/t4'](\%)$, wherein t1' represents a distance between the first portion 402a' and the second portion 402b' of the third surface 402' of the dielectric layer 40'; t2' represents a distance between the fourth surface 123' of the first passivation layer 12' and the second surface 401' of the dielectric layer 40; t3' represents a distance between the first portion 402a' and the third portion 402c' of the third surface 402' of the dielectric layer 40'; and t4' represents a distance between the fifth surface 223' of the second passivation layer 22' and the second surface 401' of the dielectric layer 40'. As shown in FIG. 7, t1' is smaller than t2' and t3' is smaller than t4'. The larger the value of the planarity of the first dielectric layer 40', the less variation there is of the third surface 402' of the first dielectric layer 40'. Generally speaking, the variation of the third surface 402' of the first dielectric layer 40' is affected by that of the second surface 401' of the first dielectric layer 40'. However, due to the material characteristics of the first dielectric layer 40', the variation of the third surface 402' of the first dielectric layer 40' may be unaffected by the variation of the second surface 401' of the first dielectric layer 40'. An advantage of the material characteristics of the first dielectric layer 40' is to provide a smooth surface for extension of the first redistribution layer 50' on the dielectric layer 40'; and thus, the delamination of the first redistribution layer 50' from the standoff between the fourth surface 123' of the passivation layer 12' and the first surface 31' of the encapsulant 3' may be avoided.

The portion of the first redistribution layer 50' which electrically connects to the first die 1' and the second die 2' is attached to the first pad 11' in the aperture 17' and extends across the fourth surface 123' of the first passivation layer 12' and the third surface 402' of the first dielectric layer 40' disposed on the encapsulant 3'. As mentioned above, since the material of the encapsulant 3' contains fillers with different sizes, the first surface 31' is uneven and has a surface roughness value in the range of about 50 nm to about 100 nm. If there were no first dielectric layer 40', the portion of the first redistribution layer 50' which electrically connects to the first die 1' and the second die 2' would extend on the first surface 31' of the encapsulant 3' directly and would be easily peeled and broken due to the uneven first surface 31'. In contrast, in the embodiment of FIGS. 6 and 7, the first dielectric layer 40' covers the first surface 31' of the encapsulant 3' and provides the smoother third surface 402' with a lower surface roughness value in the range of about 1 nm to about 10 nm. Thus, the portions of the first redistribution layer 50' extending on the third surface 402' of the first dielectric layer 40' will not be easily delaminated.

Further, if there were no first dialectic layer 40', the portion of the first redistribution layer 50' which electrically connects to the first die 1' and the second die 2' would have an improper curvature at the standoff, and the first redistribution layer 50' would be additionally easily peeled and broken. In contrast, in the embodiment of FIGS. 6 and 7, the portion of the first dielectric layer 40' covering the encapsulant 3' filled between the first die 1' and the second die 2' provides the sides with gentle slopes. In such manner, the portion of the first redistribution layer 50' which electrically connects to the first die 1' and the second die 2' will not have improper curvature and will not be easily delaminated or broken.

FIG. 8A through FIG. 8L are cross-sectional views showing a method of manufacturing a semiconductor device 100'.

Figure 8A:
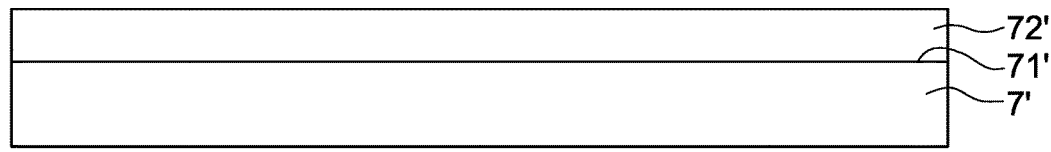
FIG. 8A, FIG. 8B, FIG. 8C, FIG. 8D, FIG. 8E, FIG. 8F, FIG. 8G, FIG. 8H, FIG. 8I, FIG. 8J, FIG. 8K and FIG. 8L are cross-sectional views showing a method of manufacturing a semiconductor device according to the second embodiment of the present disclosure.

With reference to FIG. 8A, a carrier 7' is provided and an adhesion layer 72' is positioned adjacent to a top surface 71' of the carrier 7'.

Figure 8B:
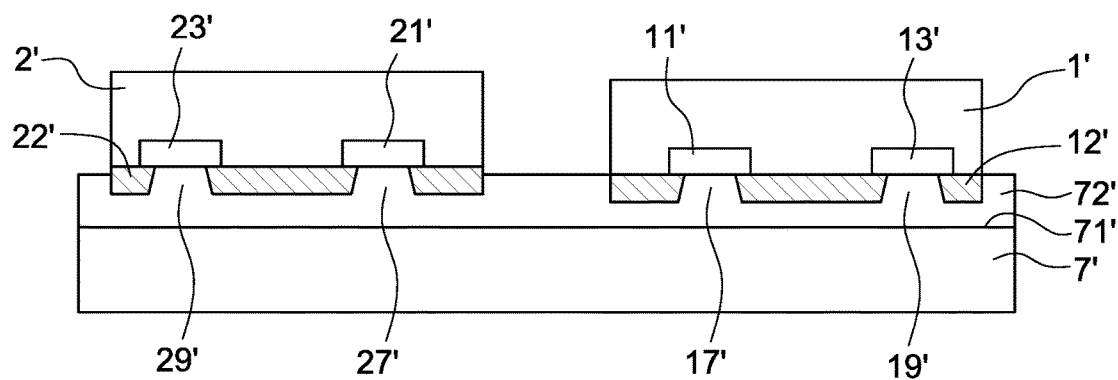

With reference to FIG. 8B, a first die 1' and a second die 2' are positioned adjacent to the adhesion layer 72'. A first passivation layer 12' of the first die 1' and a second passivation layer 22' of the second die 2' face the adhesion layer 72'. The first passivation layer 12' of the first die 1' has two apertures 17', 19', and the second passivation layer 22' of the second die 2' has two apertures 27', 29'. Thus, the first pad 11' and the third pad 13' of the first die 1', and the second pad 21' and the fourth pad 23' of the second die 2', may be partially exposed in apertures 17', 19', 27', 29'. Due to the weights of the first and second dies 1' and 2', respectively, they sink into the adhesion layer 72' while being positioned on the adhesion layer 72'. In the embodiment shown in FIG. 8B, the weight of the first die 1' is greater than that of the second die 2', and thus the position of the first die 1' is lower than that of the second die 2'. In other embodiments, the weight of the first die 1' may the same or greater than the weight of the second die 2', but the position of the first die 1' may be lower than that of the second die 2' due to the process.

Figure 8C:
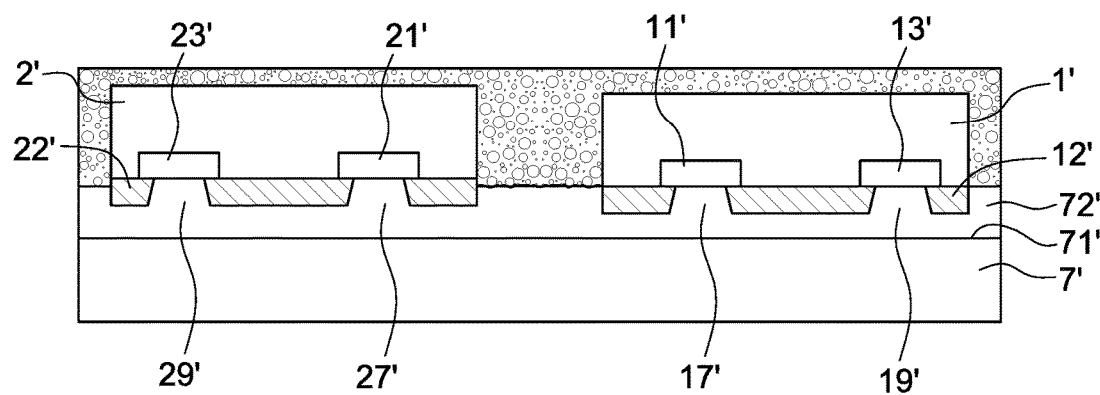

With reference to FIG. 8C, the first die 1' and the second die 2' are covered with an encapsulant 3'; thereby the encapsulant 3' surrounds the first die 1' and the second die 2'.

Figure 8D:
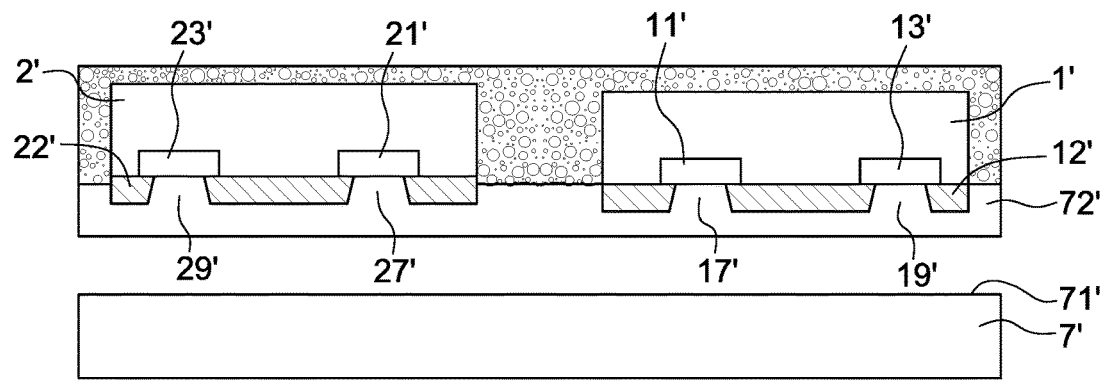

With reference to FIG. 8D, the carrier 7' is removed by a heat process.

Figure 8E:
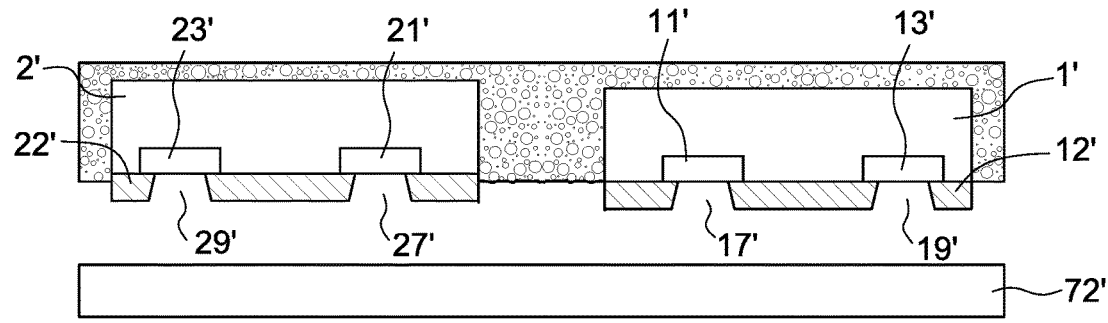

With reference to FIG. 8E, the adhesion layer 72' is removed by a heat process.

Figure 8F:
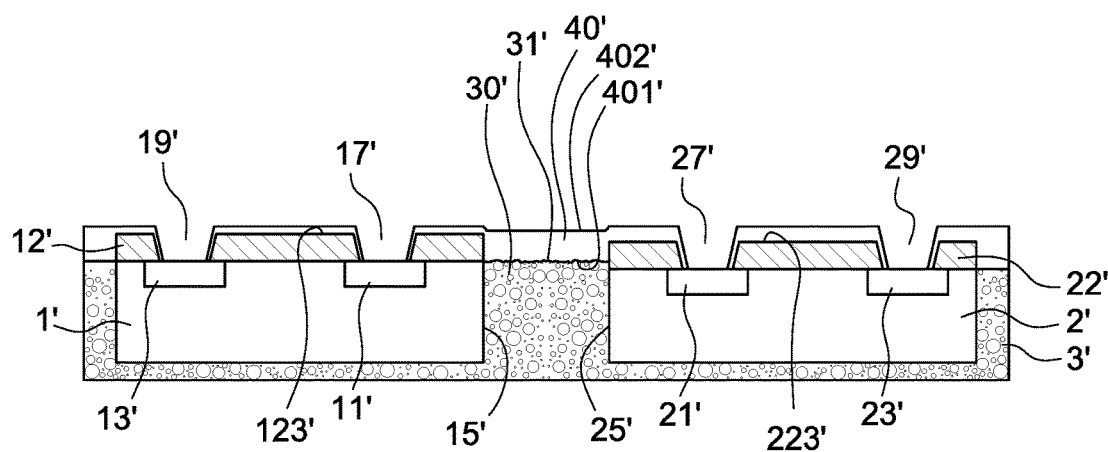

With reference to FIG. 8F, a first dielectric layer 40' is formed to cover the encapsulant 3', the whole first passivation layer 13' of the first die 1', and the whole second passivation 23' of the second die 3'. A second surface 401' of the first dielectric layer 40' is adjacent to a fourth surface 123' of the first passivation layer 12' of the first die 1', a fifth surface 223' of the second passivation layer 22' of the second die 2', and a first surface 31' of the encapsulant 3'. In addition, the surface roughness of the third surface 402' of the first dielectric layer 40' is less than that of the first surface 31' of the encapsulant 3'. As shown in FIG. 8F, the first dielectric layer 40' extends into the apertures 17', 19', 27', 29'.

Figure 8G:
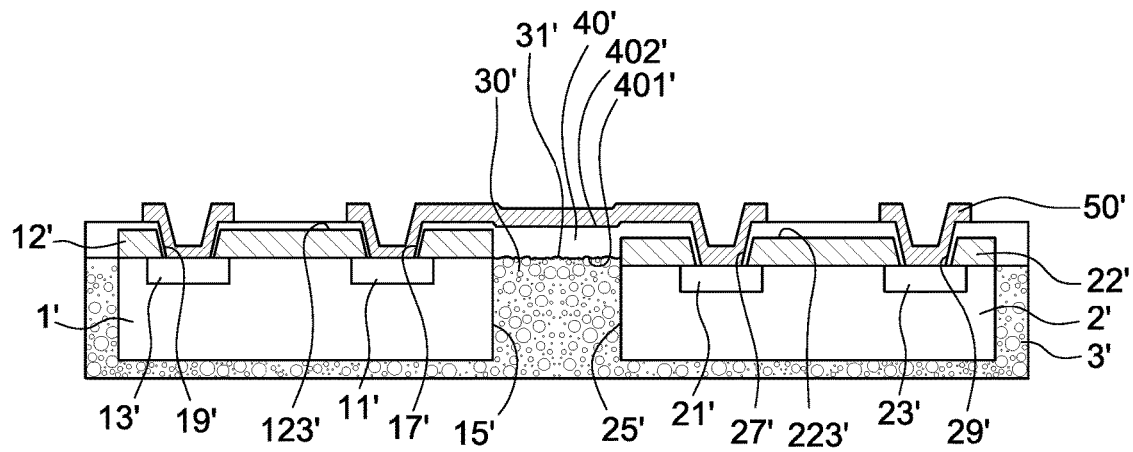

With reference to FIG. 8G, a first redistribution layer 50' is provided, wherein a portion of the first redistribution layer 50' is arranged to electrically connect to the first pad 11' of the first die 1' and the second pad 21' of the second die 2'. Other portions of the first redistribution layer 50' are arranged to attach to and electrically connect to the third pad 13' of the first die 1' and the fourth pad 23' of the second die 2'. The portion of the first redistribution layer 50' electrically connecting to the first pad 11' of the first die 1 and the second pad 21' of the second die 2' is attached to the first pad 11' and the second pad 21' and extends across a portion of the first dielectric layer 40' that is disposed above the encapsulant 3' filled between the first die 1' and the second die 2'.

Figure 8H:
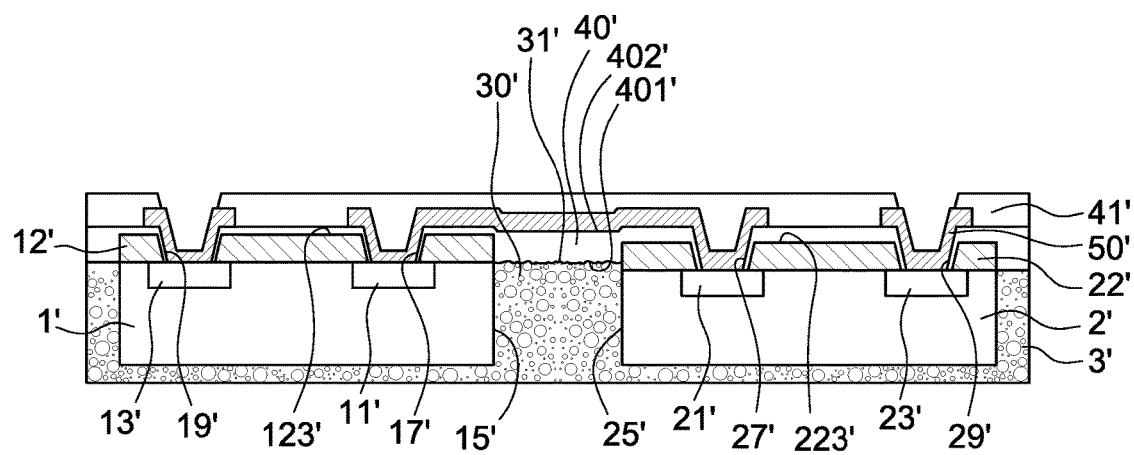

With reference to FIG. 8H, a second dielectric layer 41', which may be similar to or different from the first dielectric layer 40', is arranged on the first dielectric layer 40' and the first redistribution layer 50'.

Figure 8I:
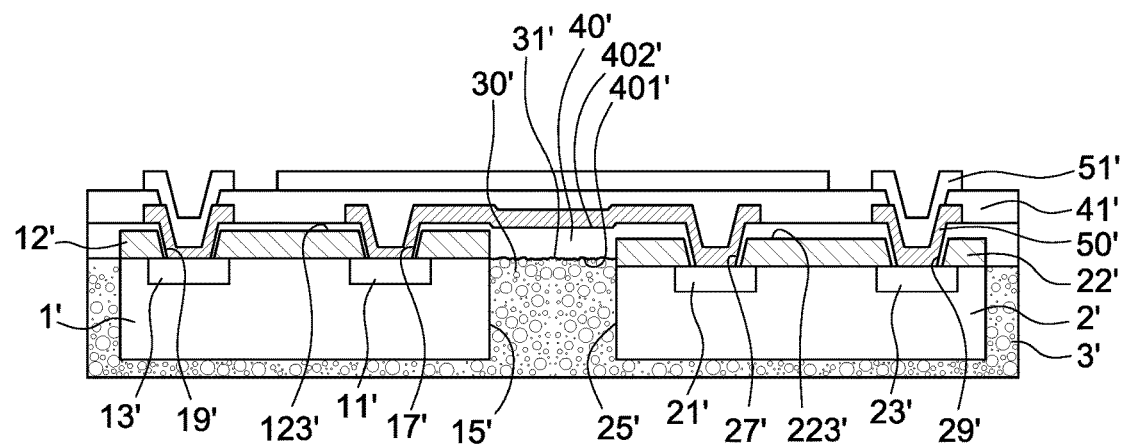
Figure 8J:
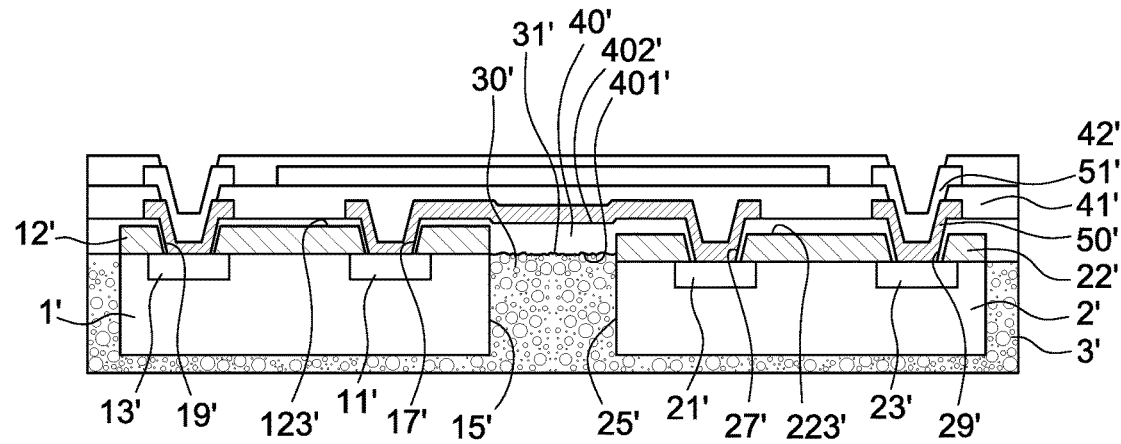
Figure 8K:
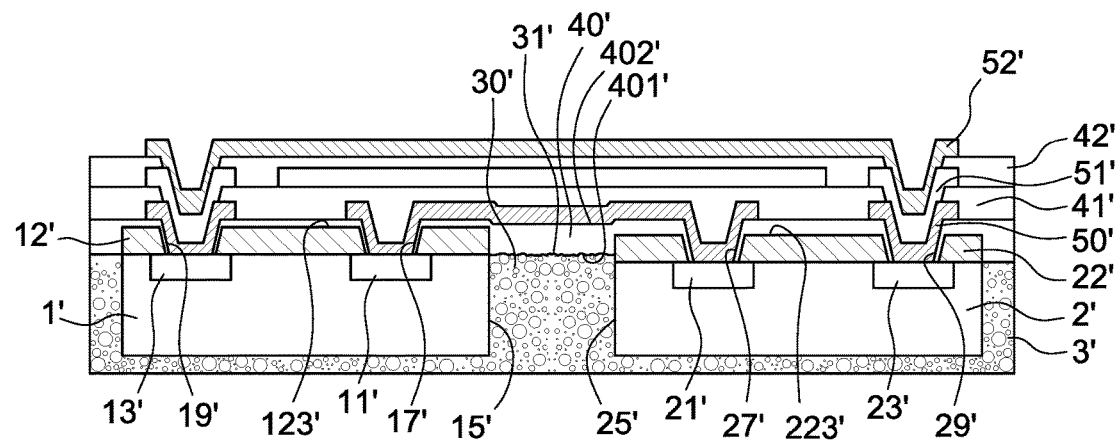
Figure 8L:
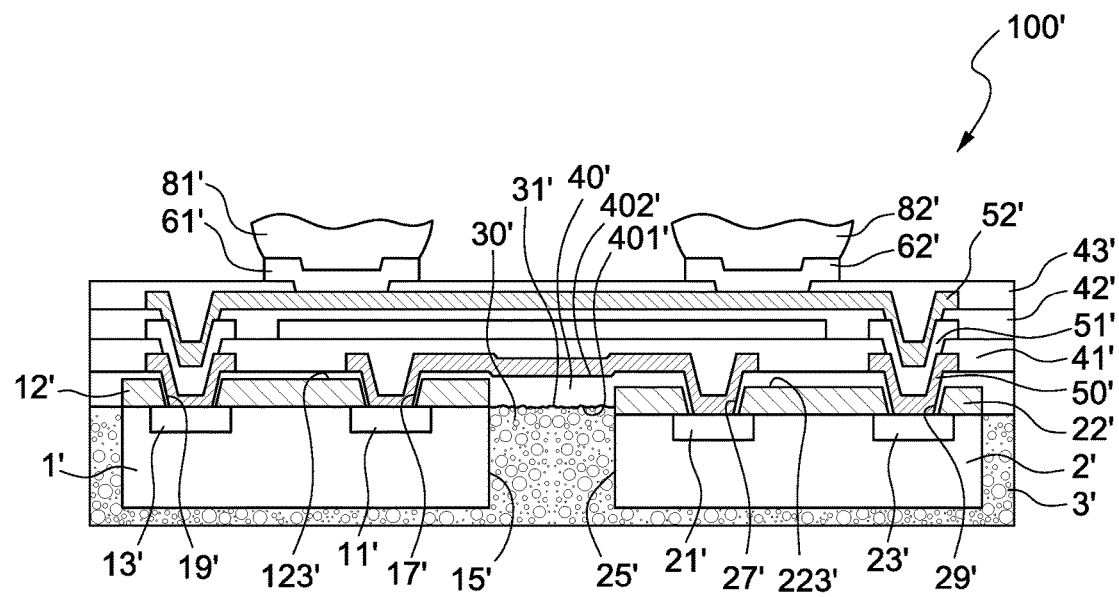

With reference to FIG. 8I, a second redistribution layer 51' is arranged on the second dielectric layer 41' and attached to the first redistribution layer 50'. In particular, portions of the second redistribution layer 51' are stacked on portions of the first redistribution layer 50' attached to the second pad 13' of the first die 1' and the fourth pad 23' of the second die 2'.

With reference to 8J, a third dielectric layer 42', which may be similar to or different from the first dielectric layer 40' or the second dielectric layer 41', is arranged on the second dielectric layer 41'.

With reference to 8K, a third redistribution layer 52' is arranged on the third dielectric layer 42' and attached to the second redistribution layer 51'. In this way, the third redistribution layer 52' electrically connects to the first and second redistribution layers 50', 51', respectively. In particular, portions of the third redistribution layer 52' are stacked on portions of the second redistribution layer 51' that are in turn stacked on portions of the first redistribution layer 50'. The third redistribution layer 52' electrically connects to the third pad 13' in the aperture 19' and the fourth pad 23' in the aperture 29', and thus electrically connects to the first die 1' and the second die 2'.

With reference to 8L, a fourth dielectric layer 43', which may be similar to or different from the first dielectric layer 40', the second dielectric layer 41', or the third dielectric layer 42', is arranged on the third dielectric layer 42'. Under bump metallurgies 61', 62' are arranged on the fourth dielectric layer 43' and attached to the third redistribution layer 52', and thus electrically connect to the first, second and third redistribution layers 50', 51', 52', respectively. In addition, solder balls 81' and 82' are attached to the under bump metallurgies 61', 62', respectively.

Figure 9:
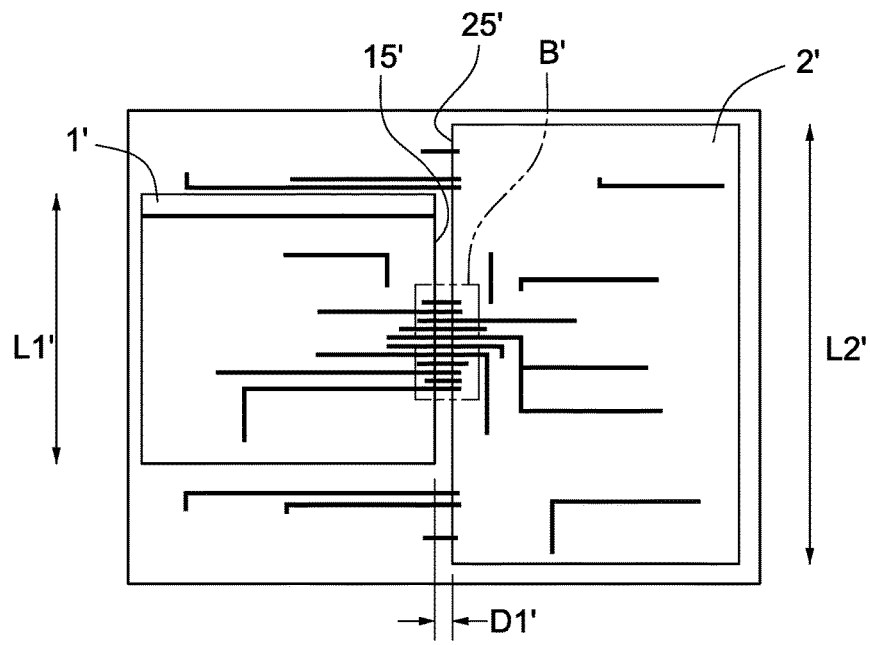
FIG. 9 is a bottom view of a semiconductor device according to the second embodiment of the present disclosure.

FIG. 9 is a bottom view of a semiconductor device 100' such as the semiconductor device 100' shown in FIG. 6.

In the embodiment of FIG. 9, a length L1' along a first sidewall 15' of the first die 1' is about 10 mm, a length L2' along a second sidewall 25' of the second die 2' is about 20 mm, and a distance D1' between the first sidewall 15' of the first die 1' and second sidewall 25' of the second die 2' is about 100 Thus, a ration of L1' to D1', or a ratio of L2' to D1', is greater than 100. Further, the first redistribution layer 50' may provide more than 1000 connections in a narrow area (portion B' in FIG. 9) between the first die 1' and the second die 2'.

Figure 10:
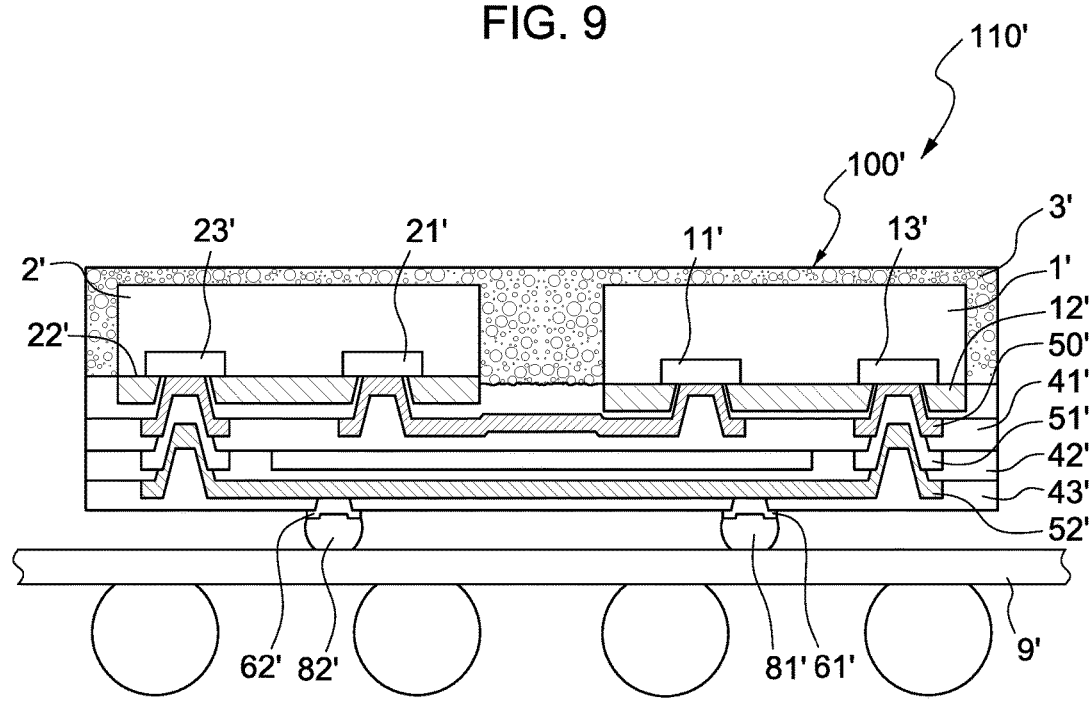
FIG. 10 is a cross-sectional view of a semiconductor package structure including the semiconductor device according to the second embodiment of the present disclosure.

FIG. 10 is a cross-sectional view of a semiconductor package structure including a semiconductor device according to another embodiment of the present disclosure.

FIG. 10 shows a semiconductor package structure 110' comprising a semiconductor device 100' and a substrate 9', wherein the semiconductor device 100' is attached to the substrate 9' by solder balls 81' and 82'. The substrate 9' is a package substrate, which can be, for example, metal, ceramic, glass-reinforced epoxy (e.g., FR4), polyimide, silicon, or Bismaleimide/Triazine (BT) resin.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A semiconductor device, comprising:
a first die comprising a first pad and a first passivation layer;
a second die comprising a second pad and a second passivation layer, wherein the first die has a first sidewall and the second die has a second sidewall;
an encapsulant surrounding the first die and the second die and comprising a first surface;
a dielectric layer covering at least a portion of the first passivation layer and at least a portion of the second passivation layer, and further covering the encapsulant between the first die and the second die, wherein the dielectric layer comprises:
a second surface adjacent to the first passivation layer, the second passivation layer and the encapsulant; and
a third surface opposite to the second surface; and
a redistribution layer electrically connected to the first pad and the second pad and disposed above the third surface of the dielectric layer;
wherein surfaces of the first die are not coplanar with corresponding surfaces of the second die;
wherein the first passivation layer has a fourth surface adjacent to the dielectric layer; and
wherein an angle between the fourth surface of the first passivation layer and a side surface of the dielectric layer is greater than 90 degrees, and wherein the side surface of the dielectric layer is formed between the second surface and the third surface of the dielectric layer.

2. The semiconductor device of claim 1, wherein:
the second passivation layer has a fifth surface adjacent to the dielectric layer;
the first surface of the encapsulant is adjacent to the second surface of the dielectric layer;
the third surface of the dielectric layer comprises three portions, a first portion arranged above the encapsulant, a second portion arranged above the first passivation layer and a third portion arranged above the second passivation layer;
a first distance between the first portion of the third surface of the dielectric layer and the first surface of the encapsulant is greater than a second distance between the second portion of the third surface of the dielectric layer and the fourth surface of the first passivation layer; and
the first distance is greater than a third distance between the third portion of the third surface of the dielectric layer and the fifth surface of the second passivation layer.

3. The semiconductor device of claim 2, wherein a fourth distance between the fourth surface of the first passivation layer and the first surface of the encapsulant is not equal to a fifth distance between the fifth surface of the second passivation layer and the first surface of the encapsulant.

4. The semiconductor device of claim 2, wherein
a distance between the first portion and the second portion of the third surface of the dielectric layer is smaller than a distance between the fourth surface of the first passivation layer and the second surface of the dielectric layer, or wherein a distance between the first portion and the third portion of the third surface of the dielectric layer is smaller than a distance between the fifth surface of the second passivation layer and the second surface of the dielectric layer.

5. The semiconductor device of claim 2, wherein a planarity of the third surface of the dielectric layer is greater than 90%, and the planarity of the third surface of the dielectric layer is equal to $100\times[1-t1/t2](\%)$ or $100\times[1-t3/t4](\%)$, where
$t1$ represents a distance between the first portion and the second portion of the third surface of the dielectric layer;
$t2$ represents a distance between the fourth surface of the first passivation layer and the second surface of the dielectric layer;
$t3$ represents a distance between the first portion and the third portion of the third surface of the dielectric layer; and
$t4$ represents a distance between the fifth surface of the second passivation layer and the second surface of the dielectric layer.

6. The semiconductor device of claim 1, wherein the first die is positioned higher than the second die.

7. The semiconductor device of claim 1, wherein the second die has a second top surface configured to dispose the second passivation layer, and the second top surface is positioned lower than the first surface of the encapsulant.

8. A semiconductor device, comprising:
a first die comprising a first pad and a first passivation layer;
a second die comprising a second pad and a second passivation layer, wherein the first die has a first sidewall and the second die has a second sidewall;
an encapsulant surrounding the first die and the second die and comprising a first surface;
a dielectric layer covering at least a portion of the first passivation layer and at least a portion of the second passivation layer, and further covering the encapsulant between the first die and the second die, wherein the dielectric layer comprises:
a second surface adjacent to the first passivation layer, the second passivation layer and the encapsulant; and
a third surface opposite to the second surface; and
a redistribution layer electrically connected to the first pad and the second pad and disposed above the third surface of the dielectric layer;
wherein a surface of the first pad is not coplanar with a corresponding surface of the second pad;
wherein the first passivation layer has a fourth surface adjacent to the dielectric layer; and
wherein an angle between the fourth surface of the first passivation layer and a side surface of the dielectric layer is greater than 90 degrees, and wherein the side surface of the dielectric layer is formed between the second surface and the third surface of the dielectric layer.

9. The semiconductor device of claim 8, wherein the first pad is positioned higher than the second pad.

10. The semiconductor device of claim 8, wherein the second pad is positioned lower than the first surface of the encapsulant.

11. The semiconductor device of claim 8, wherein:
the second passivation layer has a fifth surface adjacent to the dielectric layer;
the first surface of the encapsulant is adjacent to the second surface of the dielectric layer;
the third surface of the dielectric layer comprises a first portion arranged above the encapsulant, a second portion arranged above the first passivation layer and a third portion arranged above the second passivation layer;
a first distance between the first portion of the third surface of the dielectric layer and the first surface of the encapsulant is greater than a second distance between the second portion of the third surface of the dielectric layer and the fourth surface of the first passivation layer; and
the first distance is greater than a third distance between the third portion of the third surface of the dielectric layer and the fifth surface of the second passivation layer.

12. The semiconductor device of claim 11, wherein a fourth distance between the fourth surface of the first passivation layer and the first surface of the encapsulant is not equal to a fifth distance between the fifth surface of the second passivation layer and the first surface of the encapsulant.

13. The semiconductor device of claim 11, wherein a distance between the first portion and the second portion of the third surface of the dielectric layer is smaller than a distance between the fourth surface of the first passivation layer and the second surface of the dielectric layer, or wherein a distance between the first portion and the third portion of the third surface of the dielectric layer is smaller than a distance between the fifth surface of the second passivation layer and the second surface of the dielectric layer.

14. The semiconductor device of claim 11, wherein a planarity of the third surface of the dielectric layer is greater than 90%, and the planarity of the third surface of the dielectric layer is equal to 100×[1−t1/t2](%) or 100×[1−t3/t4](%), where:
t1 represents a distance between the first portion and the second portion of the third surface of the dielectric layer;
t2 represents a distance between the fourth surface of the first passivation layer and the second surface of the dielectric layer;
t3 represents a distance between the first portion and the third portion of the third surface of the dielectric layer; and
t4 represents a distance between the fifth surface of the second passivation layer and the second surface of the dielectric layer.

15. A semiconductor device, comprising:
a first die comprising a first top surface, a first sidewall, a first pad and a first passivation layer, wherein the first pad and the first passivation layer are adjacent to the first top surface;
a second die comprising a second top surface, a second sidewall, a second pad and a second passivation layer, wherein the second pad and the second passivation layer are adjacent to the second top surface;
an encapsulant surrounding the first die and the second die and comprising a first surface;
a dielectric layer covering at least a portion of the first passivation layer and at least a portion of the second passivation layer, and further covering the encapsulant between the first die and the second die, wherein the dielectric layer comprises:
a second surface adjacent to the first passivation layer, the second passivation layer and the encapsulant; and
a third surface opposite to the second surface; and
a redistribution layer electrically connected to the first pad and the second pad and disposed above the third surface of the dielectric layer;
wherein the second top surface and the first surface of the encapsulant are disposed along different planes;
wherein the first passivation layer has a fourth surface adjacent to the dielectric layer; and
wherein an angle between the fourth surface of the first passivation layer and a side surface of the dielectric layer is greater than 90 degrees, and wherein the side surface of the dielectric layer is formed between the second surface and the third surface of the dielectric layer.

16. The semiconductor device of claim 15, wherein the second top surface is positioned lower than the first surface of the encapsulant.

* * * * *